United States Patent
Kobayashi et al.

(10) Patent No.: US 12,221,389 B2
(45) Date of Patent: Feb. 11, 2025

(54) ALUMINUM/CERAMIC BONDING SUBSTRATE AND METHOD FOR PRODUCING SAME

(71) Applicants: DOWA METALTECH CO, LTD., Tokyo (JP); Mitsubishi Electric Corporation, Tokyo (JP)

(72) Inventors: Koji Kobayashi, Tokyo (JP); Takuma Tsubota, Tokyo (JP); Hideyo Osanai, Tokyo (JP); Daisuke Oya, Tokyo (JP)

(73) Assignees: DOWA METALTECH CO., LTD., Tokyo (JP); Mitsubishi Electric Corporation, Tokyo (JP)

( * ) Notice: Subject to any disclaimer, the term of this patent is extended or adjusted under 35 U.S.C. 154(b) by 54 days.

(21) Appl. No.: 17/383,541

(22) Filed: Jul. 23, 2021

(65) Prior Publication Data
US 2022/0033317 A1    Feb. 3, 2022

(30) Foreign Application Priority Data

Jul. 29, 2020 (JP) .................... 2020-128068

(51) Int. Cl.
*C22C 21/08* (2006.01)
*B32B 15/04* (2006.01)
(Continued)

(52) U.S. Cl.
CPC ............ *C04B 37/021* (2013.01); *C22C 21/08* (2013.01); *H05K 3/101* (2013.01); *B32B 15/04* (2013.01);
(Continued)

(58) Field of Classification Search
CPC ............... H01L 24/29; H01L 24/30; H01L 2224/29083; H01L 2224/29147; C22C 21/08; B32B 15/043
See application file for complete search history.

(56) References Cited

U.S. PATENT DOCUMENTS

2014/0057131 A1* 2/2014 Osanai .................. H05K 3/022
164/75

FOREIGN PATENT DOCUMENTS

| JP | 2001085808 A | 3/2001 |
| JP | 2002329814 A | 11/2002 |

(Continued)

OTHER PUBLICATIONS

Aluminum Alloys—Effects of Alloying Elements, captured from http://www.totalmateria.com/Article55.htm on May 19, 2023 (Publication Date, Sep. 2002) (Year: 2002).*

(Continued)

*Primary Examiner* — Adam Krupicka
(74) *Attorney, Agent, or Firm* — Bachman & LaPointe, P.C.

(57) ABSTRACT

There is provided an aluminum/ceramic bonding substrate having a ceramic substrate, an aluminum plate of an aluminum alloy which is bonded directly to one side of the ceramic substrate, an aluminum base plate of the aluminum alloy which is bonded directly to the other side of the ceramic substrate, and a plate-shaped reinforcing member which has a higher strength than that of the aluminum base plate and which is arranged in the aluminum base plate to be bonded directly to the aluminum base plate, wherein the aluminum alloy contains 0.01 to 0.2% by weight of magnesium, 0.01 to 0.1% by weight of silicon, and the balance being aluminum and unavoidable impurities.

9 Claims, 1 Drawing Sheet

(51) Int. Cl.
  *C04B 37/02*  (2006.01)
  *H05K 3/10*  (2006.01)
(52) U.S. Cl.
  CPC .... *C04B 2235/95* (2013.01); *C04B 2237/366* (2013.01); *C04B 2237/402* (2013.01); *C04B 2237/704* (2013.01); *H05K 2203/128* (2013.01)

(56) References Cited

FOREIGN PATENT DOCUMENTS

| | | | |
|---|---|---|---|
| JP | 2003243803 | A | 8/2003 |
| JP | 2005252136 | A | 9/2005 |
| JP | 2007092150 | A | 4/2007 |
| JP | 2011189354 | A | 9/2011 |
| JP | 2019029510 | A | 2/2019 |

OTHER PUBLICATIONS

Office action dated Apr. 22, 2024 issued in corresponding Application DE102021119042.8.

\* cited by examiner

ALUMINUM/CERAMIC BONDING SUBSTRATE AND METHOD FOR PRODUCING SAME

BACKGROUND OF THE INVENTION

Field of the Invention

The present invention generally relates to an aluminum/ceramic bonding substrate and a method for producing the same. More specifically, the invention relates to an aluminum/ceramic bonding substrate wherein an aluminum member of an aluminum alloy containing silicon is bonded to a ceramic substrate, and a method for producing the same.

Description of the Prior Art

In recent years, as insulating substrates for high-reliable power modules for controlling heavy-current for electric vehicles, machine tools and so forth, there is used an aluminum/ceramic bonding substrate wherein an aluminum member is bonded to a ceramic substrate. If the aluminum member of such an aluminum/ceramic bonding substrate is bonded to a heat radiating plate, such as a copper plate, via a solder, there are some cases where the difference in coefficient of thermal expansion between the aluminum member and the solder causes a stress to be generated to the bonded interface therebetween by heat cycles and causes the stress to generate cracks in the relatively weak solder layer to deteriorate the heat radiation performance of the heat radiating plate. In order to solve such problems, it is known that an aluminum member of an aluminum alloy (aluminum-silicon alloy) containing (0.2 to 5% by weight of) silicon is used as the aluminum member of the aluminum/ceramic bonding substrate (see, e.g., JP 2002-329814 A).

However, if an aluminum member of an aluminum-silicon alloy, particularly an aluminum alloy containing 0.1 to 1.5% by weight of silicon, is bonded to a ceramic substrate by a molten metal bonding method, it is difficult to miniaturize the crystal grains of the alloy by optimizing usual cooling conditions, so that there are problems in that silicon is excessively deposited in grain boundaries and/or in that the enriching section of silicon exists in the aluminum member. For that reason, there are some cases where hot cracks are generated in the aluminum member during the cooling process, so that the aluminum/ceramic bonding substrate does not function as a desired aluminum/ceramic bonding substrate. In addition, if etching is carried out for forming a circuit of the aluminum member, there are some cases where the enriching section of silicon remains on the surface of the ceramic substrate without being dissolved, so that it is not possible to obtain the desired insulation characteristics of the aluminum/ceramic bonding substrate.

In order to solve such problems, there is proposed that an aluminum-silicon-boron alloy, which is prepared by adding boron to an aluminum-silicon alloy, is bonded to a ceramic substrate by the molten metal bonding method to miniaturize the crystal grains of the alloy to increase the number of grain boundaries to prevent the macroscopic segregation of silicon to prevent silicon from remaining on the surface of the ceramic substrate to improve the insulation properties of the aluminum/ceramic bonding substrate while preventing the heat radiation performance of a heat radiating plate from being deteriorated by preventing cracks from being generated in a solder layer by heat cycles even if the heat radiating plate is soldered on the aluminum/ceramic bonding substrate (see, e.g., JP 2005-252136 A).

However, if an aluminum member of an aluminum-silicon-boron alloy is bonded to a ceramic substrate by the molten metal bonding method, an aluminum-boron compound is crystalized out during solidification, although the crystal grains of the alloy are miniaturized. This aluminum-boron compound remains as the nucleus of aluminum, which contains silicon as the solid solution thereof, or remains between dendrites. For that reason, if the aluminum member is etched to form a circuit, there are some cases where the aluminum-boron compound remains on the surface of the ceramic substrate without being dissolved. Thereafter, if the circuit is plated, there is a problem in that the remaining aluminum-boron compound is plated to cause insulation resistance failure between patterns and appearance failure. There is also a problem in that the aluminum-boron compound deposited on the surface of the aluminum member deteriorates the plating performance thereof.

In order to solve such problems, as an aluminum/ceramic bonding substrate wherein an aluminum member of an aluminum alloy containing silicon and boron is bonded to a ceramic substrate and which is able to miniaturize the crystal grains of the aluminum alloy to increase the number of grain boundaries and to effectively suppress the deposition of the aluminum-boron compound to carry out good etching while improving the plating performance thereof, there is proposed an aluminum/ceramic bonding substrate wherein an aluminum member of an aluminum alloy is bonded to a ceramic substrate and wherein the aluminum alloy comprises 0.1 to 1.5% by weight of silicon, 0.02 to 0.1% by weight of boron, at least one element, which is selected from 0.005 to 0.2% by weight of iron, 0.005 to 0.3% by weight of at least one element selected from the group consisting of zinc, copper, silver and magnesium, and 0.001 to 0.05% by weight of at least one element selected from the group consisting of consisting of titanium, vanadium and manganese, and the balance being aluminum and unavoidable impurities (see, e.g., JP 2007-92150 A).

However, in the aluminum/ceramic bonding substrate disclosed in JP 2007-92150 A, there are some cases where unbonded portions, which are bonding failures, are generated between the aluminum member of the aluminum alloy and the ceramic substrate and/or where the stress generated by the difference in thermal expansion between the aluminum member and the ceramic substrate generates cracks in the ceramic substrate to deteriorate the heat cycle resistance thereof when heat cycles are repeatedly applied during bonding or after bonding.

SUMMARY OF THE INVENTION

It is therefore an object of the present invention to eliminate the aforementioned problems and to provide an aluminum/ceramic bonding substrate wherein an aluminum plate of an aluminum alloy is bonded directly to one side of a ceramic substrate and wherein an aluminum base plate of the aluminum alloy is bonded directly to the other side of the ceramic substrate, the aluminum/ceramic bonding substrate having a small number of bonding failures between the aluminum plate and the ceramic substrate and between the aluminum base plate and the ceramic substrate, the aluminum/ceramic bonding substrate having an excellent heat cycle resistance, and a method for producing the same.

In order to accomplish the aforementioned and other objects, the inventors have diligently studied and found that it is possible to provide an aluminum/ceramic bonding substrate wherein an aluminum plate of an aluminum alloy is bonded directly to one side of a ceramic substrate and wherein an aluminum base plate of the aluminum alloy is bonded directly to the other side of the ceramic substrate, the aluminum/ceramic bonding substrate having a small number of bonding failures between the aluminum plate and the ceramic substrate and between the aluminum base plate and the ceramic substrate, the aluminum/ceramic bonding substrate having an excellent heat cycle resistance, and a method for producing the same, if a plate-shaped reinforcing member having a higher strength than that of the aluminum base plate is arranged in the aluminum base plate to be bonded directly to the aluminum base plate and if the aluminum alloy contains 0.01 to 0.2% by weight of magnesium, 0.01 to 0.1% by weight of silicon and the balance being aluminum and unavoidable impurities. Thus, the inventors have made the present invention.

According to the present invention, there is provided an aluminum/ceramic bonding substrate comprising: a ceramic substrate; an aluminum plate of an aluminum alloy which is bonded directly to one side of the ceramic substrate; an aluminum base plate of the aluminum alloy which is bonded directly to the other side of the ceramic substrate; and a plate-shaped reinforcing member having a higher strength than that of the aluminum base plate, the reinforcing member being arranged in the aluminum base plate to be bonded directly to the aluminum base plate, wherein the aluminum alloy contains 0.01 to 0.2% by weight of magnesium, 0.01 to 0.1% by weight of silicon, and the balance being aluminum and unavoidable impurities.

In this aluminum/ceramic bonding substrate, the aluminum alloy may contain 0.01 to 0.1% by weight of titanium. The aluminum plate preferably has a surface having an average crystalline particle diameter of not greater than 7 mm. The aluminum plate preferably has a Vickers hardness HV of not higher than 23. The aluminum plate preferably has a Vickers hardness HV of not higher than 25 after a heat cycle, in which the aluminum/ceramic bonding substrate is sequentially held at a temperature of −40° C. for 30 minutes, at a temperature of 25° C. for 10 minutes, at a temperature of 150° C. for 30 minutes and at a temperature of 25° C. for 10 minutes, is repeated one thousand times. The aluminum base plate preferably has a thermal conductivity of not less than 180 W/m·K. The reinforcing member preferably extends in directions parallel to a bonded surface of the aluminum base plate to the ceramic substrate. The reinforcing member is preferably made of a metal or ceramic, which has a higher melting point than that of the aluminum alloy. The ceramic substrate is preferably made of at least one selected from the group consisting of alumina, aluminum nitride, silicon nitride and silicon carbide.

According to the present invention, there is provided a method for producing an aluminum/ceramic bonding substrate, the method comprising the steps of: arranging a ceramic substrate and a reinforcing member in a mold so that the ceramic substrate is apart from the reinforcing member; injecting a molten metal of an aluminum alloy so that the molten metal contacts both sides of the ceramic substrate and the surface of the reinforcing member in the mold; cooling the mold to solidify the molten metal to form an aluminum plate of the aluminum alloy on one side of the ceramic substrate to allow the aluminum plate to be bonded directly to the one side of the ceramic substrate while forming an aluminum base plate of the aluminum alloy on the other side of the ceramic substrate to allow the aluminum base plate to be bonded directly to the other side of the ceramic substrate and while arranging the reinforcing member so as to be surrounded by the aluminum base plate to be bonded directly to the aluminum base plate, wherein the aluminum alloy contains 0.01 to 0.2% by weight of magnesium, 0.01 to 0.1% by weight of silicon, and the balance being aluminum and unavoidable impurities.

In this method for producing an aluminum/ceramic bonding substrate, the aluminum alloy may contain 0.01 to 0.1% by weight of titanium. The reinforcing member is preferably made of a metal or ceramic, which has a higher melting point than that of the aluminum alloy. The ceramic substrate is preferably made of at least one selected from the group consisting of alumina, aluminum nitride, silicon nitride and silicon carbide.

According to the present invention, it is possible to provide an aluminum/ceramic bonding substrate wherein an aluminum plate of an aluminum alloy is bonded directly to one side of a ceramic substrate and wherein an aluminum base plate of the aluminum alloy is bonded directly to the other side of the ceramic substrate, the aluminum/ceramic bonding substrate having a small number of bonding failures between the aluminum plate and the ceramic substrate and between the aluminum base plate and the ceramic substrate, the aluminum/ceramic bonding substrate having an excellent heat cycle resistance, and a method for producing the same.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, particularly to FIGS. 1 and 2, the preferred embodiment of an aluminum/ceramic bonding substrate and a method for producing the same according to the present invention will be described below in detail.

Figure 1:
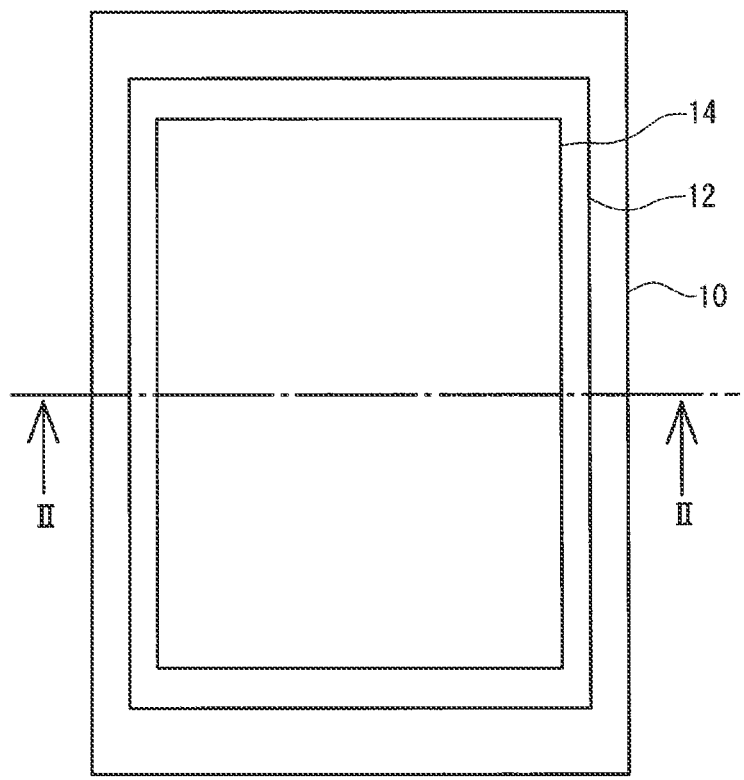
FIG. 1 is a plan view of the preferred embodiment of an aluminum/ceramic bonding substrate according to the present invention.
Figure 2:
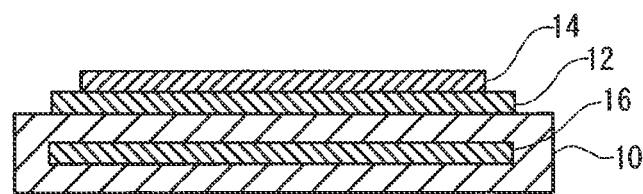
FIG. 2 is a sectional view taken along line II-II of FIG. 1.

As shown in FIGS. 1 and 2, the preferred embodiment of an aluminum/ceramic bonding substrate according to the present invention comprises: an aluminum base plate 10 of an aluminum alloy (having a substantially rectangular planar shape in the shown preferred embodiment); a ceramic substrate 12 (having a substantially rectangular planar shape in the shown preferred embodiment), one side of the ceramic substrate 12 being bonded directly to the aluminum base plate 10; and an aluminum plate 14 (for circuit pattern) of the aluminum alloy (having a substantially rectangular planar shape in the shown preferred embodiment), the aluminum plate 14 being bonded directly to the other side of the ceramic substrate 12. In the aluminum base plate 10, a plate-shaped reinforcing member 16 (having a substantially rectangular planar shape in the shown preferred embodiment) is arranged on a (phantom) plane substantially parallel to the bonded surface of the aluminum base plate 10 to the ceramic substrate 12, and the surface of the reinforcing member 16 is bonded directly to the aluminum base plate 10. By the reinforcing member 16 thus arranged in the aluminum base plate 10, it is possible to decrease the warpage of the aluminum/ceramic bonding substrate and the variation in warpage thereof, particularly the warpage of the aluminum/ceramic bonding substrate in longitudinal directions thereof and the variation in warpage thereof.

Furthermore, the aluminum alloy of the aluminum base plate 10 and aluminum plate 14 is an aluminum alloy (Al—Mg—Si alloy) which contains 0.01 to 0.2% by weight (preferably 0.02 to 0.15% by weight) of magnesium, 0.01 to 0.1% by weight (preferably 0.02 to 0.08% by weight) of silicon, and the balance being aluminum and unavoidable impurities. This aluminum alloy may be an aluminum alloy (Al—Mg—Si—Ti alloy) which further contains 0.01 to 0.1% by weight of titanium. This aluminum alloy may be an alloy obtained by adding magnesium and silicon (and titanium) to a material of aluminum having a purity of 99.9% (3N).

The surface of the aluminum plate 14 (for circuit pattern) preferably has an average crystalline particle diameter of not greater than 7 mm, and more preferably has an average crystalline particle diameter of not greater than 6 mm.

The aluminum plate 14 preferably has a Vickers hardness HV of not higher than 23, and more preferably has a Vickers hardness HV of not higher than 20. The aluminum plate 14 preferably has a Vickers hardness HV of not higher than 25 after a heat cycle, in which the aluminum/ceramic bonding substrate is sequentially held at a temperature of −40° C. for 30 minutes, at a temperature of 25° C. for 10 minutes, at a temperature of 150° C. for 30 minutes and at a temperature of 25° C. for 10 minutes, is repeated one thousand times.

The aluminum base plate 10 preferably has a thermal conductivity of not less than 180 W/m·K, and more preferably has a thermal conductivity of not less than 200 W/m·K.

The ceramic substrate 12 is preferably made of at least one selected from the group consisting of alumina, aluminum nitride, silicon nitride and silicon carbide.

The reinforcing member 16 is preferably made of a metal or ceramic, which has higher melting point and strength than those of the aluminum alloy of the aluminum base plate 10.

The aluminum/ceramic bonding substrate in the above-described preferred embodiment can be produced by a method comprising the steps of: arranging a ceramic substrate 12 and a reinforcing member 16 in a mold so that the ceramic substrate 12 is apart from the reinforcing member 16; injecting a molten metal of the aluminum alloy so that the molten metal contacts both sides of the ceramic substrate 12 and the surface of the reinforcing member 16; cooling the mold.

Examples of an aluminum/ceramic bonding substrate and a method for producing the same according to the present invention will be described below in detail.

Example 1

First, a ceramic substrate of AlN having a size of 120 mm×92 mm×1 mm and a reinforcing member of AlN having a size of 126 mm×94 mm×1 mm were arranged in a mold of carbon so that the ceramic substrate is apart from the reinforcing member by 2.6 mm. Then, this mold was put in a furnace, and the interior of the furnace was caused to be in an atmosphere of nitrogen to decrease the oxygen concentration therein to 4 ppm or less. In this state, the mold was heated to 720° C. by the temperature control of a heater, and then, a molten metal of an aluminum alloy (containing 0.025% by weight of magnesium, 0.04% by weight of silicon, 0.02% by weight of titanium, and the balance being aluminum and unavoidable impurities (of less than 0.04% by weight of iron and less than 0.02% by weight of boron)), which was heated to 720° C., was poured into the mold from an injecting nozzle mounted on the inlet of the mold while being pressurized by nitrogen gas to remove oxide films on the surface of the molten metal. Thus, the molten metal was filled in the mold. Then, while the molten metal in the mold was pressurized by blowing nitrogen gas into the mold from the injecting nozzle, the mold was cooled at a cooling rate of about 20° C./minute to solidify the molten metal, and then, the mold was cooled at a cooling rate of about 50° C./minute. Thus, by a so-called molten metal bonding method, there was produced an aluminum/ceramic bonding substrate wherein an aluminum base plate having a size of 140 mm×100 mm×4 mm, in which the reinforcing member having the size of 126 mm×94 mm×1 mm was arranged to be bonded directly to the aluminum base plate, was bonded directly to one side of the ceramic substrate having the size of 120 mm×92 mm×1 mm and wherein an aluminum plate (for circuit pattern) having a size of 114 mm×86 mm×0.4 mm was bonded directly to the other side of the ceramic substrate.

The surface of the aluminum plate (for circuit pattern) of the aluminum/ceramic bonding substrate thus obtained was washed with sodium hydroxide, buffed and etched with a ferric chloride solution. Then, this surface was observed by an optical microscope to obtain the average crystalline particle diameter of the aluminum alloy thereon by a method according to the method of section based on JIS H0501. As a result, the average crystalline particle diameter was not greater than 1 mm. The thermal conductivity (of the aluminum alloy) of the aluminum base plate of the aluminum/ceramic bonding substrate was obtained by the laser flash method. As a result, the thermal conductivity was 206 W/m·K.

After the surface of the aluminum plate (for circuit pattern) of the obtained aluminum/ceramic bonding substrate was washed with sodium hydroxide and buffed, a resist was formed on the surface thereof. Then, the surface of the aluminum plate for circuit pattern was etched with a ferric chloride solution to remove unnecessary portions of the aluminum plate for circuit pattern to form an aluminum circuit plate having a desired pattern. Thereafter, the resist was stripped off by a resist stripping solution to prepare an aluminum/ceramic circuit board.

After a nickel plating film having a thickness of 5 μm was formed on a part of the surface of the aluminum circuit plate of the aluminum/ceramic circuit board thus prepared, there was carried out a heat-proof test wherein the aluminum/ceramic circuit board was heated at 360° C. for 3 minutes in an atmosphere of nitrogen after it was heated at 280° C. for 3 minutes therein. Then, the nickel plating film formed on the part of the surface was observed with the naked eye. As a result, no blisters were observed thereon. After a chip part was soldered on the nickel plating film, even if a heat cycle, in which the aluminum/ceramic bonding substrate was sequentially held at a temperature of −40° C. for 30 minutes, at a temperature of 25° C. for 10 minutes, at a temperature of 150° C. for 30 minutes and at a temperature of 25° C. for 10 minutes, was repeatedly applied on the aluminum/ceramic circuit board one thousand times, the chip part was not broken.

With respect to the prepared aluminum/ceramic circuit board, the bonded portion of the ceramic substrate to the aluminum circuit plate was observed by an ultrasonic tester (Scanning Acoustic Tomograph (SAT)) (FS100II produced by Hitachi Construction Machinery-Finetech Co., Ltd.). As a result, unbonded portions were not observed. The appearance of the aluminum/ceramic circuit board was observed with the naked eye. As a result, bond defects, such as shrinkage cavities and intercrystalline cracks, were not observed, so that the aluminum circuit plate was satisfactorily bonded to the ceramic substrate.

With respect to the prepared aluminum/ceramic circuit board, a test load of 10 gf was applied to the aluminum circuit plate for 5 seconds to measure the Vickers Hardness HV of the aluminum circuit plate by means of a Vickers hardness meter (HM-210 produced by Mitsutoyo Corporation). As a result, the Vickers hardness HV was 16.7. As the surface roughness of the surface of the aluminum circuit plate, the arithmetic average roughness Ra thereof was obtained. As a result, the arithmetic average roughness Ra was 0.50 μm.

After a heat shock, in which the prepared aluminum/ceramic circuit board was sequentially held at a temperature of −40° C. for 4 minutes, at a room temperature for 30 seconds, at a temperature of 125° C. for 4 minutes and at a room temperature for 30 seconds, was repeated 500 times, 1000 times, 1500 times and 2000 times, respectively, the Vickers hardness HV of the aluminum circuit plate was measured by the same method as the above-described method. As a result, the Vickers hardness HV was 17.8, 18.3, 18.5 and 18.7, respectively. After the above-described heat shock was repeated 500 times and 1000 times, respectively, the arithmetic average roughness Ra of the surface of the aluminum circuit plate was obtained by the same method as the above-described method. As a result, the arithmetic average roughness Ra was 0.84 μm and 1.24 μm, respectively.

After a heat cycle, in which the prepared aluminum/ceramic circuit board was sequentially held at a temperature of −40° C. for 30 minutes, at a temperature of 25° C. for 10 minutes, at a temperature of 150° C. for 30 minutes and at a temperature of 25° C. for 10 minutes, was repeated 100 times, 300 times, 500 times and 1000 times, respectively, the Vickers hardness HV of the aluminum circuit plate was measured by the same method as the above-described method. As a result, the Vickers hardness HV was 18.0, 18.5, 18.6 and 19.8, respectively. After the above-described heat cycle was repeated 100 times, 300 times, 500 times and 1000 times, respectively, the arithmetic average roughness Ra of the surface of the aluminum circuit plate was obtained by the same method as the above-described method. As a result, the arithmetic average roughness Ra was 0.67 μm, 0.91 μm, 1.13 μm and 1.80 μm, respectively. After the heat cycle was repeated 1000 times, cracks were not generated in the ceramic substrate.

Example 2

An aluminum/ceramic bonding substrate was produced by the same method as that in Example 1, except that the content of magnesium in the aluminum alloy was 0.05% by weight. The average crystalline particle diameter on the surface of the aluminum plate for circuit pattern of the aluminum/ceramic bonding substrate was obtained by the same method as that in Example 1. As a result, the average crystalline particle diameter was not greater than 1 mm. The thermal conductivity of the aluminum base plate of the aluminum/ceramic bonding substrate was obtained by the same method as that in Example 1. As a result, the thermal conductivity was 204 W/m·K.

By the same methods as those in Example 1, an aluminum/ceramic circuit board was prepared, and a nickel plating film formed on a part of the surface of the aluminum circuit plate thereof was observed with the naked eye after the heat-proof test. As a result, blisters were not observed on the nickel plating film. By the same method as that in Example 1, a chip part soldered on the nickel plating film was observed after the heat cycles. As a result, the chip part was not broken (even after 1000 heat cycles).

By the same method as that in Example 1, the bonded portion of the ceramic substrate to the aluminum circuit plate was observed. As a result, unbonded portions were not observed, and bond defects, such as shrinkage cavities and intercrystalline cracks, were not observed, so that the aluminum circuit plate was satisfactorily bonded to the ceramic substrate.

By the same methods as those in Example 1, the Vickers hardness HV of the aluminum circuit plate of the aluminum/ceramic circuit board was measured, and the arithmetic average roughness Ra of the surface thereof was obtained. As a result, the Vickers hardness Hv was 16.7, and the arithmetic average roughness Ra was 0.66 μm.

By the same methods as those in Example 1, after the heat shock was repeatedly applied on the aluminum/ceramic circuit board 500 times and 1000 times, respectively, the Vickers hardness HV of the aluminum circuit plate was measured, and the arithmetic average roughness Ra of the surface thereof was obtained. As a result, the Vickers hardness HV was 19.1 and 20.1, respectively, and the arithmetic average roughness Ra was 0.72 μm and 0.96 μm, respectively.

By the same methods as those in Example 1, after the heat cycle was repeatedly applied on the aluminum/ceramic circuit board 100 times, 300 times, 500 times and 1000 times, respectively, the Vickers hardness HV of the aluminum circuit plate was measured, and the arithmetic average roughness Ra of the surface thereof was obtained. As a result, the Vickers hardness HV was 18.8, 19.2, 20.6 and 22.2, respectively, and the arithmetic average roughness Ra was 0.64 μm, 0.83 g m, 1.19 μm and 1.91 μm, respectively. After the heat cycle was repeated 1000 times, cracks were not generated in the ceramic substrate.

Example 3

An aluminum/ceramic bonding substrate was produced by the same method as that in Example 1, except that the aluminum alloy was an aluminum alloy containing 0.025% by weight of magnesium, 0.04% by weight of silicon, and the balance being aluminum and unavoidable impurities (of less than 0.04% by weight of iron). The average crystalline particle diameter on the surface of the aluminum plate for circuit pattern of the aluminum/ceramic bonding substrate was obtained by the same method as that in Example 1. As a result, the average crystalline particle diameter was 2 to 5 mm.

By the same methods as those in Example 1, an aluminum/ceramic circuit board was prepared, and a nickel plating film formed on a part of the surface of the aluminum circuit plate thereof was observed with the naked eye after the heat-proof test. As a result, blisters were not observed on the nickel plating film. By the same method as that in Example 1, a chip part soldered on the nickel plating film was observed after the heat cycles. As a result, the chip part was not broken (even after 1000 heat cycles).

By the same method as that in Example 1, the bonded portion of the ceramic substrate to the aluminum circuit plate was observed. As a result, unbonded portions were not observed, and bond defects, such as shrinkage cavities and intercrystalline cracks, were not observed, so that the aluminum circuit plate was satisfactorily bonded to the ceramic substrate.

After the heat cycle was repeatedly applied on the aluminum/ceramic circuit board 1000 times by the same method as that in Example 1, cracks were not generated in the ceramic substrate.

Example 4

An aluminum/ceramic bonding substrate was produced by the same method as that in Example 1, except that the aluminum alloy was an aluminum alloy containing 0.05% by weight of magnesium, 0.04% by weight of silicon, and the balance being aluminum and unavoidable impurities (of less than 0.04% by weight of iron). The average crystalline particle diameter on the surface of the aluminum plate for circuit pattern of the aluminum/ceramic bonding substrate was obtained by the same method as that in Example 1. As a result, the average crystalline particle diameter was 2 to 5 mm. The thermal conductivity of the aluminum base plate of the aluminum/ceramic bonding substrate was obtained by the same method as that in Example 1. As a result, the thermal conductivity was 204 W/m·K.

By the same methods as those in Example 1, an aluminum/ceramic circuit board was prepared, and a nickel plating film formed on a part of the surface of the aluminum circuit plate thereof was observed with the naked eye after the heat-proof test. As a result, blisters were not observed on the nickel plating film. By the same method as that in Example 1, a chip part soldered on the nickel plating film was observed after the heat cycles. As a result, the chip part was not broken (even after 1000 heat cycles).

By the same method as that in Example 1, the bonded portion of the ceramic substrate to the aluminum circuit plate was observed. As a result, unbonded portions were not observed, and bond defects, such as shrinkage cavities and intercrystalline cracks, were not observed, so that the aluminum circuit plate was satisfactorily bonded to the ceramic substrate.

After the heat cycle was repeatedly applied on the aluminum/ceramic circuit board 1000 times by the same method as that in Example 1, cracks were not generated in the ceramic substrate.

Example 5

An aluminum/ceramic bonding substrate was produced by the same method as that in Example 1, except that the aluminum alloy was an aluminum alloy (containing 0.04% by weight of silicon, 0.025% by weight of magnesium, and the balance being aluminum and unavoidable impurities (of less than 0.04% by weight of iron)), which was obtained by adding an aluminum alloy (containing 0.20 to 0.60% by weight of silicon, 0.45 to 0.90% by weight of magnesium, and the balance being aluminum and unavoidable impurities (of less than 0.35% by weight of iron)) to aluminum having a purity of 99.9% by weight (3N). The average crystalline particle diameter on the surface of the aluminum plate for circuit pattern of the aluminum/ceramic bonding substrate was obtained by the same method as that in Example 1. As a result, the average crystalline particle diameter was 2 to 5 mm.

By the same methods as those in Example 1, an aluminum/ceramic circuit board was prepared, and a nickel plating film formed on a part of the surface of the aluminum circuit plate thereof was observed with the naked eye after the heat-proof test. As a result, blisters were not observed on the nickel plating film. By the same method as that in Example 1, a chip part soldered on the nickel plating film was observed after the heat cycles. As a result, the chip part was not broken (even after 1000 heat cycles).

By the same method as that in Example 1, the bonded portion of the ceramic substrate to the aluminum circuit plate was observed. As a result, unbonded portions were not observed, and bond defects, such as shrinkage cavities and intercrystalline cracks, were not observed, so that the aluminum circuit plate was satisfactorily bonded to the ceramic substrate.

By the same method as that in Example 1, the Vickers hardness HV of the aluminum circuit plate of the aluminum/ceramic circuit board was measured. As a result, the Vickers hardness Hv was 19.8.

By the same method as that in Example 1, after the heat shock was repeatedly applied on the aluminum/ceramic circuit board 500 times, 1000 times and 1500 times, respectively, the Vickers hardness HV of the aluminum circuit plate was measured. As a result, the Vickers hardness HV was 20.4, 21.6 and 21.5, respectively.

After the heat cycle was repeatedly applied on the aluminum/ceramic circuit board 1000 times by the same method as that in Example 1, cracks were not generated in the ceramic substrate.

Example 6

An aluminum/ceramic bonding substrate was produced by the same method as that in Example 1, except that the aluminum alloy was an aluminum alloy (containing 0.04% by weight of silicon, 0.05% by weight of magnesium, and the balance being aluminum and unavoidable impurities (of less than 0.04% by weight of iron)), which was obtained by adding an aluminum alloy (containing 0.20 to 0.60% by weight of silicon, 0.45 to 0.90% by weight of magnesium, and the balance being aluminum and unavoidable impurities (of less than 0.35% by weight of iron)) to aluminum having a purity of 99.9% by weight (3N). The average crystalline particle diameter on the surface of the aluminum plate for circuit pattern of the aluminum/ceramic bonding substrate was obtained by the same method as that in Example 1. As a result, the average crystalline particle diameter was 2 to 5 mm. The thermal conductivity of the aluminum base plate of the aluminum/ceramic bonding substrate was obtained by the same method as that in Example 1. As a result, the thermal conductivity was 195 W/m·K.

By the same methods as those in Example 1, an aluminum/ceramic circuit board was prepared, and a nickel plating film formed on a part of the surface of the aluminum circuit plate thereof was observed with the naked eye after the heat-proof test. As a result, blisters were not observed on the nickel plating film. By the same method as that in Example 1, a chip part soldered on the nickel plating film was observed after the heat cycles. As a result, the chip part was not broken (even after 1000 heat cycles).

By the same method as that in Example 1, the bonded portion of the ceramic substrate to the aluminum circuit plate was observed. As a result, unbonded portions were not observed, and bond defects, such as shrinkage cavities and intercrystalline cracks, were not observed, so that the aluminum circuit plate was satisfactorily bonded to the ceramic substrate.

By the same method as that in Example 1, the Vickers hardness HV of the aluminum circuit plate of the aluminum/ceramic circuit board was measured. As a result, the Vickers hardness Hv was 21.4.

By the same method as that in Example 1, after the heat shock was repeatedly applied on the aluminum/ceramic circuit board 500 times, 1000 times and 1500 times, respectively, the Vickers hardness HV of the aluminum circuit plate was measured. As a result, the Vickers hardness HV was 22.1, 24.2 and 21.4, respectively.

After the heat cycle was repeatedly applied on the aluminum/ceramic circuit board 1000 times by the same method as that in Example 1, cracks were not generated in the ceramic substrate.

Comparative Example 1

An aluminum/ceramic bonding substrate was produced by the same method as that in Example 1, except that aluminum having a purity of 99.9% by weight (3N) was used in place of the aluminum alloy. The average crystalline particle diameter on the surface of the aluminum plate for circuit pattern of the aluminum/ceramic bonding substrate was obtained by the same method as that in Example 1. As a result, the average crystalline particle diameter was not less than 10 mm. The thermal conductivity of the aluminum base plate of the aluminum/ceramic bonding substrate was obtained by the same method as that in Example 1. As a result, the thermal conductivity was 210 W/m·K.

By the same methods as those in Example 1, an aluminum/ceramic circuit board was prepared, and a nickel plating film formed on a part of the surface of the aluminum circuit plate thereof was observed with the naked eye after the heat-proof test. As a result, blisters were not observed on the nickel plating film. By the same method as that in Example 1, a chip part soldered on the nickel plating film was observed after the heat cycles. As a result, the chip part was broken (after 1000 heat cycles).

By the same method as that in Example 1, the bonded portion of the ceramic substrate to the aluminum circuit plate was observed. As a result, unbonded portions were not observed, and bond defects, such as shrinkage cavities and intercrystalline cracks, were not observed, so that the aluminum circuit plate was satisfactorily bonded to the ceramic substrate.

After the heat cycle was repeatedly applied on the aluminum/ceramic circuit board 1000 times by the same method as that in Example 1, cracks were not generated in the ceramic substrate.

Comparative Example 2

An aluminum/ceramic bonding substrate was produced by the same method as that in Example 1, except that the aluminum alloy was an aluminum alloy containing 0.35 to 0.40% by weight of silicon, 0.035 to 0.045% by weight of boron, 0.004 to 0.015% by weight of iron, and the balance being aluminum and unavoidable impurities. The average crystalline particle diameter on the surface of the aluminum plate for circuit pattern of the aluminum/ceramic bonding substrate was obtained by the same method as that in Example 1. As a result, the average crystalline particle diameter was about 1.5 mm. The thermal conductivity of the aluminum base plate of the aluminum/ceramic bonding substrate was obtained by the same method as that in Example 1. As a result, the thermal conductivity was 190 W/m·K.

By the same methods as those in Example 1, an aluminum/ceramic circuit board was prepared, and a nickel plating film formed on a part of the surface of the aluminum circuit plate thereof was observed with the naked eye after the heat-proof test. As a result, blisters were observed on the nickel plating film. By the same method as that in Example 1, a chip part soldered on the nickel plating film was observed after the heat cycles. As a result, the chip part was not broken (even after 1000 heat cycles).

By the same method as that in Example 1, the bonded portion of the ceramic substrate to the aluminum circuit plate was observed. As a result, unbonded portions were observed, and bond defects, such as shrinkage cavities and intercrystalline cracks, were observed, so that the aluminum circuit plate was not satisfactorily bonded to the ceramic substrate.

By the same methods as those in Example 1, the Vickers hardness HV of the aluminum circuit plate of the aluminum/ceramic circuit board was measured, and the arithmetic average roughness Ra of the surface thereof was obtained. As a result, the Vickers hardness Hv was 20.6, and the arithmetic average roughness Ra was 0.73 µm.

By the same methods as those in Example 1, after the heat shock was repeatedly applied on the aluminum/ceramic circuit board 1000 times, the Vickers hardness HV of the aluminum circuit plate was measured, and the arithmetic average roughness Ra of the surface thereof was obtained. As a result, the Vickers hardness HV was 22.7, and the arithmetic average roughness Ra was 2.11 µm.

By the same method as that in Example 1, after the heat cycle was repeatedly applied on the aluminum/ceramic circuit board 1000 times, the arithmetic average roughness Ra of the surface thereof was obtained. As a result, the arithmetic average roughness Ra was 2.23 µm. After the heat cycle was repeated 1000 times, cracks were not generated in the ceramic substrate.

Comparative Example 3

An aluminum/ceramic bonding substrate was produced by the same method as that in Example 1, except that the aluminum alloy was an aluminum alloy containing 0.30% by weight of magnesium, 0.20% by weight of silicon, and the balance being aluminum and unavoidable impurities (of less than 0.04% by weight of iron). The average crystalline particle diameter on the surface of the aluminum plate for circuit pattern of the aluminum/ceramic bonding substrate was obtained by the same method as that in Example 1. As a result, the average crystalline particle diameter was about 2 mm.

By the same methods as those in Example 1, an aluminum/ceramic circuit board was prepared, and a nickel plating film formed on a part of the surface of the aluminum circuit plate thereof was observed with the naked eye after the heat-proof test. As a result, blisters were observed on the nickel plating film. By the same method as that in Example 1, a chip part soldered on the nickel plating film was observed after the heat cycles. As a result, the chip part was not broken (even after 1000 heat cycles).

By the same method as that in Example 1, the Vickers hardness HV of the aluminum circuit plate of the aluminum/ceramic circuit board was measured. As a result, the Vickers hardness Hv was 26.5.

After the heat cycle was repeatedly applied on the aluminum/ceramic circuit board 1000 times by the same method as that in Example 1, cracks were generated in the ceramic substrate.

What is claimed is:

1. An aluminum/ceramic bonding substrate comprising:
a ceramic substrate;
an aluminum plate of an aluminum alloy which is bonded directly to one side of the ceramic substrate;
an aluminum base plate of the aluminum alloy which is bonded directly to the other side of the ceramic substrate; and
a plate-shaped reinforcing member having a higher strength than that of the aluminum base plate, the reinforcing member being arranged in the aluminum base plate to be bonded directly to the aluminum base plate, the reinforcing member being a ceramic substrate made of aluminum nitride,
wherein the aluminum alloy contains 0.01 to 0.2% by weight of magnesium, 0.01 to 0.1% by weight of silicon, and the balance being aluminum and unavoidable impurities, and
wherein said aluminum plate has a surface having an average crystalline particle diameter of not greater than 7 mm.

2. An aluminum/ceramic bonding substrate as set forth in claim 1, wherein said aluminum alloy contains 0.01 to 0.1% by weight of titanium.

3. An aluminum/ceramic bonding substrate as set forth in claim 1, wherein said aluminum plate has a Vickers hardness HV of not higher than 23.

4. An aluminum/ceramic bonding substrate as set forth in claim 1, wherein said aluminum plate has a Vickers hardness HV of not higher than 25 after a heat cycle, in which the aluminum/ceramic bonding substrate is sequentially held at a temperature of −40° C. for 30 minutes, at a temperature of 25° C. for 10 minutes, at a temperature of 150° C. for 30 minutes and at a temperature of 25° C. for 10 minutes, is repeated one thousand times.

5. An aluminum/ceramic bonding substrate as set forth in claim 1, wherein said aluminum base plate has a thermal conductivity of not less than 180 W/m·K.

6. An aluminum/ceramic bonding substrate as set forth in claim 1, wherein said reinforcing member extends in directions parallel to a bonded surface of said aluminum base plate to said ceramic substrate.

7. An aluminum/ceramic bonding substrate as set forth in claim 1, wherein said reinforcing member is made of a metal or ceramic, which has a higher melting point than that of said aluminum alloy.

8. An aluminum/ceramic bonding substrate as set forth in claim 1, wherein said ceramic substrate is made of at least one selected from the group consisting of alumina, aluminum nitride, silicon nitride and silicon carbide.

9. An aluminum/ceramic bonding substrate as set forth in claim 1, wherein the content of magnesium in the aluminum alloy is in the range of from 0.02% by weight to 0.15% by weight, the content of silicon therein being in the range of 0.02% by weight to 0.08% by weight.

* * * * *